United States Patent
Deak (10) Patent No.: US 6,816,402 B2
(45) Date of Patent: Nov. 9, 2004

(54) ROW AND COLUMN LINE GEOMETRIES FOR IMPROVING MRAM WRITE OPERATIONS

(75) Inventor: James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/175,844

(22) Filed: Jun. 21, 2002

(65) Prior Publication Data

US 2003/0235068 A1 Dec. 25, 2003

(51) Int. Cl.$^7$ .............................................. G11C 11/00

(52) U.S. Cl. ........................................ 365/158; 365/97

(58) Field of Search ................................ 365/158, 196, 365/50, 55, 97

(56) References Cited

U.S. PATENT DOCUMENTS

| | | | | |
|---|---|---|---|---|
| 5,140,549 A | * | 8/1992 | Fryer | 365/171 |
| 5,978,257 A | * | 11/1999 | Zhu et al. | 365/173 |
| 6,236,590 B1 | * | 5/2001 | Bhattacharyya et al. | 365/173 |
| 6,473,328 B1 | * | 10/2002 | Mercaldi | 365/130 |
| 6,545,906 B1 | * | 4/2003 | Savtchenko et al. | 365/158 |
| 2002/0067581 A1 | * | 6/2002 | Hiramoto et al. | 360/322 |
| 2003/0104636 A1 | * | 6/2003 | Bloomquist et al. | 438/3 |

* cited by examiner

Primary Examiner—Thong Le
(74) Attorney, Agent, or Firm—Dickstein Shapiro Morin & Oshinsky LLP (57) ABSTRACT

A write conductor layout structure for minimizing programming currents of an MRAM is disclosed. A magnetic memory cell has sense layer which is positioned between a first conductor having a width in a first direction and a second conductor having a width in a second direction. The width of the first and/or second conductor is narrower than a corresponding width of the sense layer. At least one of the first and second conductors is positioned so that the edge of the conductor extends beyond the edge of the sense layer.

93 Claims, 6 Drawing Sheets

ROW AND COLUMN LINE GEOMETRIES FOR IMPROVING MRAM WRITE OPERATIONS

FIELD OF THE INVENTION

The present invention relates to random access memory for data storage. More specifically, the invention relates to the geometric arrangement of row and column conductors relative to memory cells in a magnetoresistive random access memory (MRAM) device.

BACKGROUND OF THE INVENTION

One known MRAM memory structure uses magnetic tunnel junction memory cells and a cross-point architecture of orthogonal row and column lines. The cells are arrayed at the intersections of the orthogonal row lines and column lines. Each memory cell stores a bit of information as a function of the orientation of relative magnetization vectors in a pinned magnetic layer and a free, also called sense, magnetic layer which are separated by a non-magnetic layer. The pinned magnetic layer is so-called because its magnetization vector is fixed in a predetermined direction. The sense layer has a magnetization vector which is programmable to two different directions. The combined magnetic field patterns of the pinned and sense layers impart a resistance to the memory cell which has two different values depending on the direction of the magnetic vector in the sense layer.

The magnetic orientation of the sense layer is typically programmed to a particular magnetic orientation using magnetic fields created with the intersecting row and column lines. The row line and the column line operate in combination to switch the orientation of magnetization of the sense layer of a selected memory cell.

Figure 1:
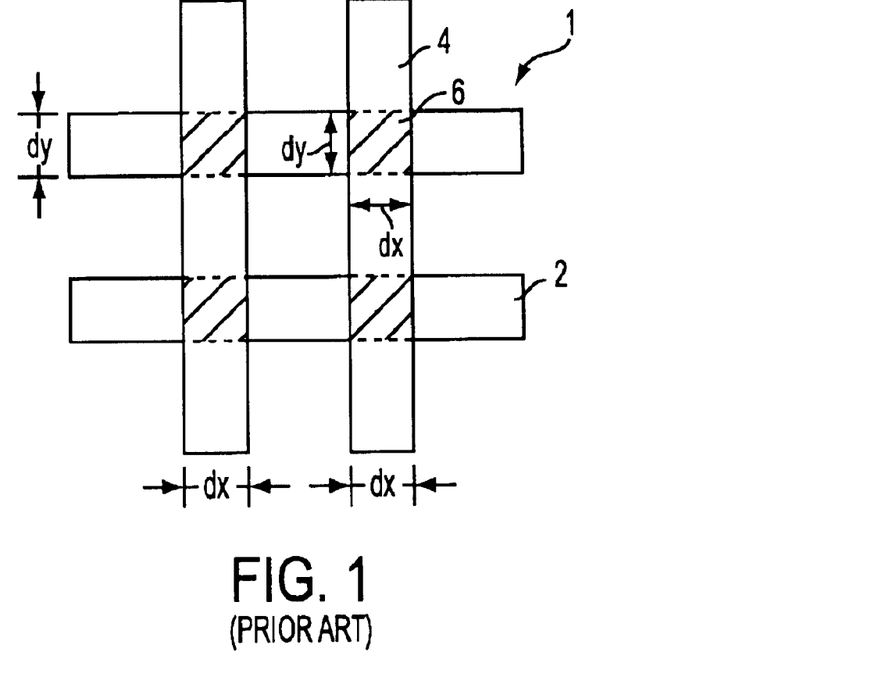
FIG. 1 is a top profile view of a portion of a prior art MRAM array having a plurality of MRAM cells.

FIG. 1 illustrates a top view of a simplified MRAM array 1, which employs the cross-point architecture. The MRAM array includes orthogonal row lines 2, and column lines 4, and, the memory cells 6 are located at the intersections of, and between, the row and column lines. The row lines 2 and the column lines 4 are typically fabricated to have the same width as that of the memory cells 6, shown as dx for the column lines 4 and dy for the row lines 2. Although shown as rectangular in FIG. 1, the memory cells 6 can take on other shapes, for example, circular or elliptical shapes, and other shapes as well.

Figure 2:
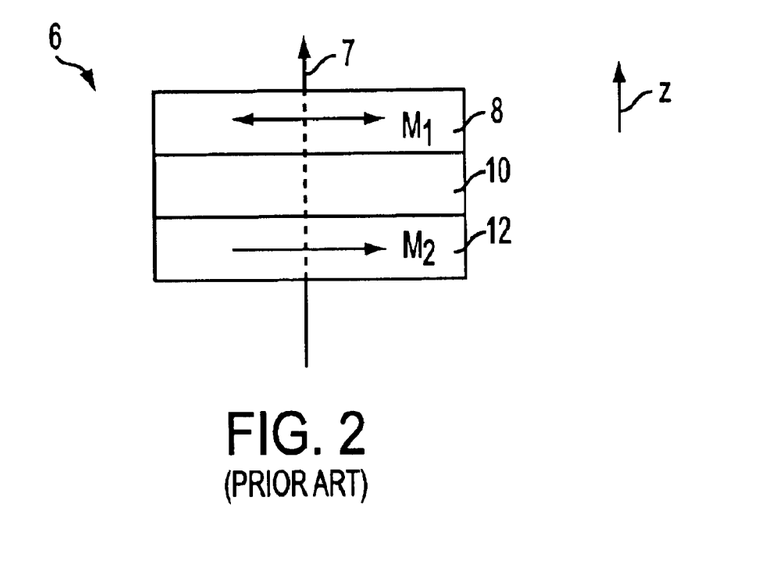
FIG. 2 is a cross-sectional view of a prior art MRAM memory cell illustrating the magnetic orientation of the pinned and sense layers.

FIG. 2 illustrates a simplified cross section of the memory cell 6. The memory cell 6 includes a ferromagnetic sense layer 8, a ferromagnetic pinned layer 12, and a non-magnetic tunnel junction layer 10 between the sense layer 8 and the pinned layer 12. The fixed magnetic orientation of the pinned layer 12 is shown by the arrow M2. The orientation of magnetization of the sense layer 8 is not fixed and can assume two stable orientations as shown by the double headed arrow M1. The sense layer 8 can change its orientation of magnetization in response to electrical currents applied to the intersecting row and column lines (2,4) during a write operation.

The logic state of the data stored in the memory cell 6 can be determined by measuring cell resistance. When M1 and M2 are anti-parallel, e.g. a logic state "0," the resistance of the memory cell 6 is the highest, whereas when M1 and M2 are parallel, e.g. logic state "1" the resistance is at its lowest. The resistance of the memory cell 6 is reflected by a magnitude of the current 7 passing perpendicular through the memory cell 6, as shown in FIG. 2.

In a typical MRAM array, both the row 2 and column 4 lines are used to select and write data to a memory cell 6. One of the disadvantages of the arrangement illustrated in FIGS. 1 and 2 is that the row line 2 and column line 4 take up too much space. Increased memory density requires shrinking the memory cell 6, which shrinks the corresponding dimensions of the row and column conductors.

In order to produce a required magnetic field to program the cells with row and column lines of decreased size an increased write current is required which in turn requires larger transistors. This makes it difficult to increase memory density since the larger transistors also increase chip size. Furthermore, larger write currents may also present reliability problems. The increased write current also increases power consumption and generates additional heat. This may affect the reliability of the write conductors, as the large current density may cause excessive electromigration issues.

SUMMARY OF THE INVENTION

The invention provides an MRAM memory device which has a reduced width for one or both of the orthogonal row and column lines relative to the corresponding memory cell width, and an offset of at least one of the lines relative to the cell center such that the offset conductive line overlaps an edge of a sense layer of a cell. When a memory cell is written, magnetization of the sense layer starts to reverse (nucleate) at the edge of the sense layer. With at least one of the row and column lines, being narrower than the associated cell width and offset, the magnetic direction of the sense layer of the cell can be reversed at a lower current than if the column and row lines are the same size or wider than the cell and are centered with respect to the cell.

The widths of the row and column lines and their offsets from the cell center may be identical or different.

There are other aspects and advantages of the present invention which will become more apparent from the following detailed description of the invention which is presented in conjunction with the accompanying drawings.

DETAILED DESCRIPTION OF THE INVENTION

In the following detailed description and in several figures of the drawings, like elements are identified with like reference numerals.

The invention is described below with reference to first and second orthogonal write conductors positioned on opposite sides of a memory cell, rather than orthogonal row and column lines because whether a particular write conductor is described as a column line or a row line is immaterial for the invention.

Figure 3:
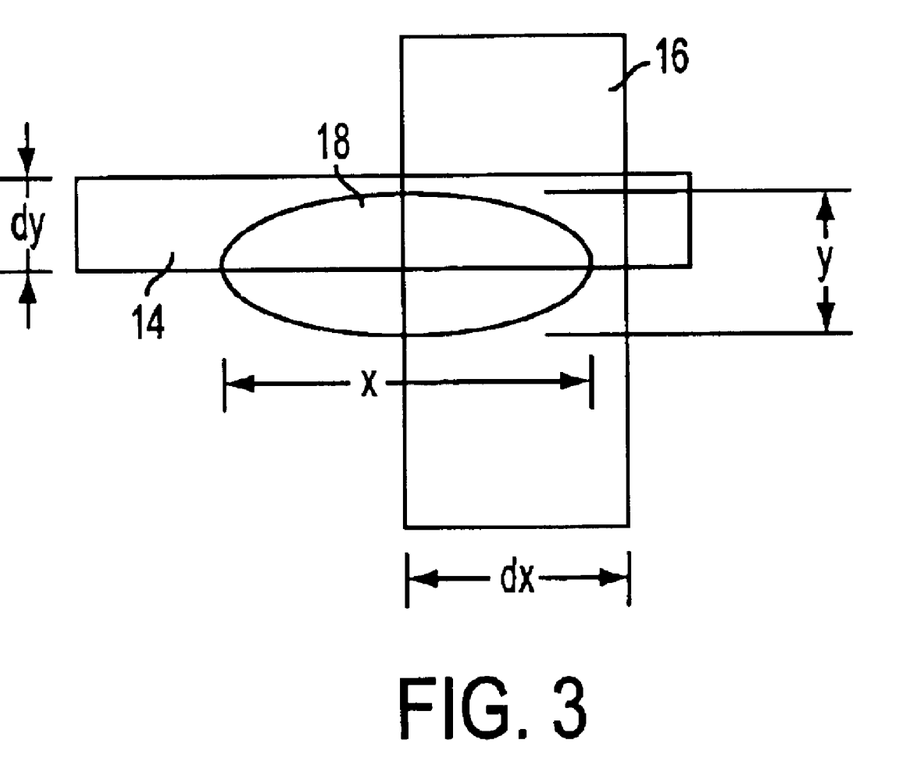
FIG. 3 is a top plan view of a write conductor layout in accordance with an exemplary embodiment of the present invention.

FIG. 3, illustrates an exemplary embodiment of the invention in which an MRAM memory cell, including a sense layer 18, is provided between a first write conductor 14 and a substantially orthogonal second write conductor 16. FIG. 3 shows the cell and associated sense layer 18 as being elliptical in shape, but other shapes are also possible. Write magnetic fields generated by the first and second write conductors (14, 16) result in a particular orientation of magnetization of the sense layer 18. One conductor generates a magnetic field known as the half select field, while the other generates a magnetic field known as the switching field. Both fields must be present to flip the magnetization of the sense layer 18 from one orientation to another.

The field generated by a flat conductor is proportional to the current density in the conductor, a narrower conductor produces a larger field for a given current. In order to improve the write efficiency of an MRAM bit, at least one, and preferably both of the first and second conductors 14, 16 should have a width which is between one-half and two-thirds of the corresponding width of the sense layer 18. Thus, second conductor 16 has a width dx which is between one-half and two-thirds of the width x of sense layer 18 in a first horizontal direction, while first conductor 14 has a width dy which is between one-half and two-thirds of the width y of sense layer 18 in a second vertical direction.

Figure 4:
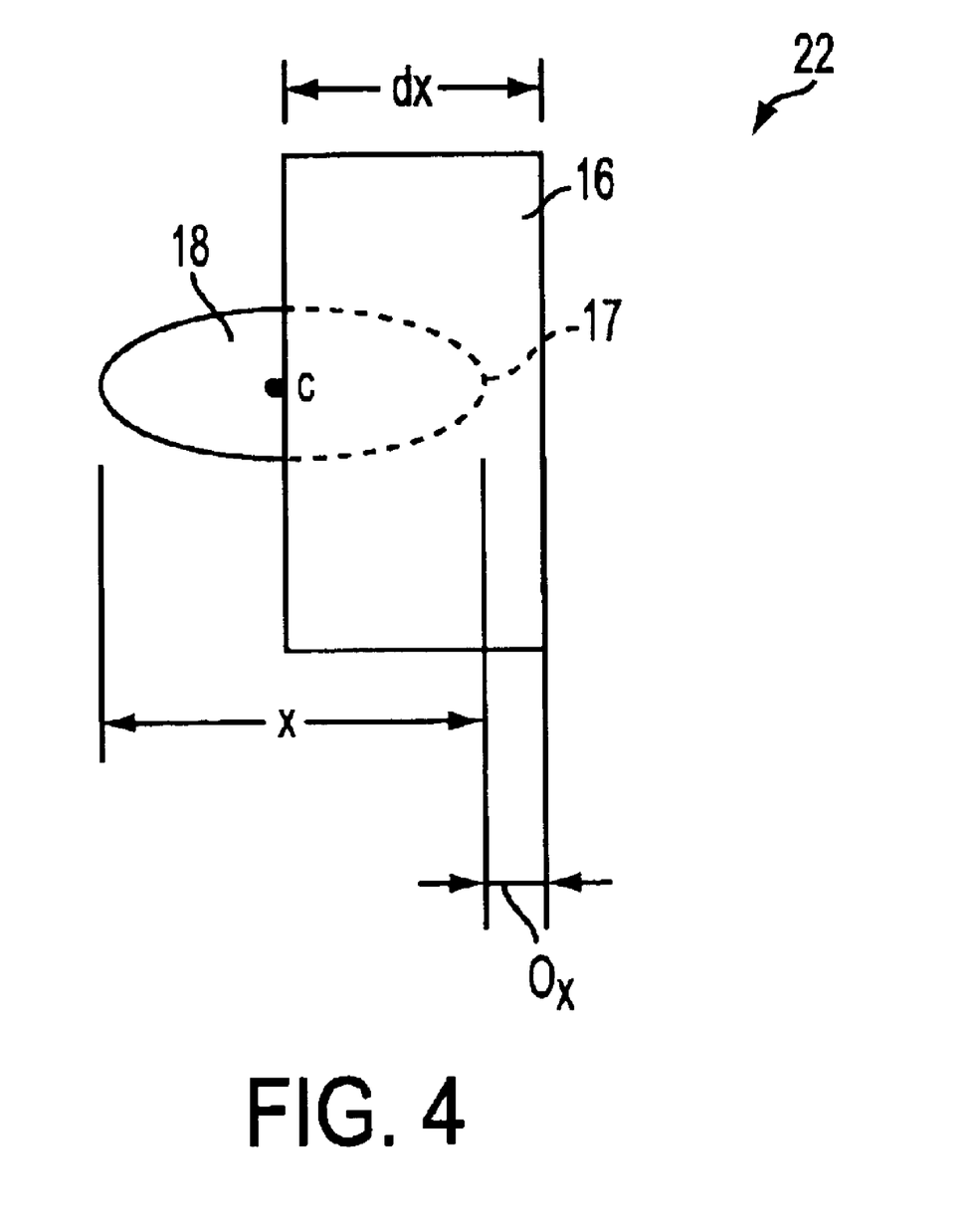
FIG. 4 is an enlarged view of a first write line shown in FIG. 3.

FIG. 4 illustrates the width and positioning of the second conductor 16 relative to the sense layer 18 in the horizontal direction. As shown in FIG. 4, the conductor 16 is offset from the center C of the sense layer 18 and extends beyond the edge 17 of the sense layer 18 in the x direction by a distance of 0x. The minimum distance 0x is determined by the distance the sense layer 18 is from the surface of the conductor as described below. The narrowing and positioning of the conductors (19, 16) maximizes the flux delivered to the edge of the sense layer 18.

It has been found that the orientation of the magnetization of the sense layer 18 begins to switch by nucleating a small volume of reversed magnetization at the edge of the sense layer 18. The magnetic flux density, Bx, when applied to the edge of the sense layer 18 by conductor 16 enhances the ability of the sense layer 18 to begin to reverse nucleate. The distance Ox is chosen to ensure that the highest magnetic flux, Bx, produced by conductor 16 is present at the edge of the sense layer 18.

Figure 5:
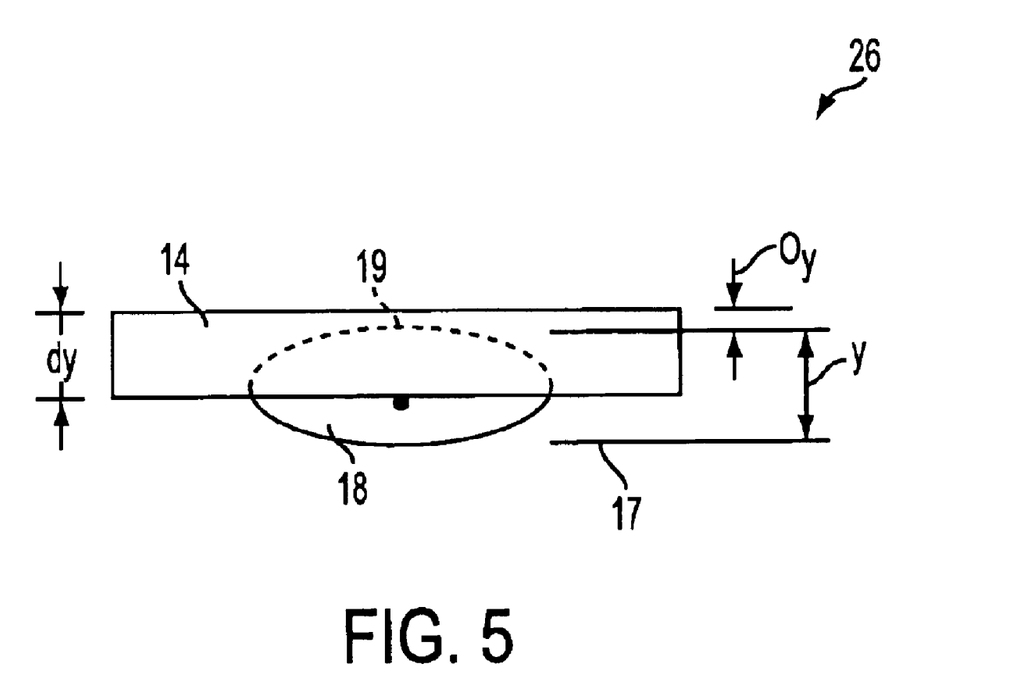
FIG. 5 is an enlarged view of a second write line shown in FIG. 3.

FIG. 5 illustrates the width and positioning of the first conductor 14 relative to the sense layer 18 in the y direction. The width dy of the first conductor 14 in the y direction is also one-half to two-thirds the width y of the sense layer 18 in the y direction. The first conductor 14 may also extend beyond an edge 19 of sense layer 18 by a distance Oy. The minimum distance Oy is determined by the distance the sense layer 18 is from the surface of the conductor 14, as described below. Again, the distance Oy is chosen so that the maximum magnetic field generated by conductor 14 is applied at the edge 19 of sense layer 18.

For purposes of illustration, the second conductor 16 is positioned above the sense layer 18 and the first conductor 14 is positioned below the sense layer 18, although they can be reversed. In addition, while FIGS. 3, 4 and 5 show conductors 16 and 14 respectively overlapping the left 17 and upper 19 edges of sense layer 18, they may instead overlap the right and lower edges respectively. As illustrated in FIGS. 4 and 5, distances 0x and 0y are shown for both conductors 16, 14; however, only one of the conductors 16, 14 need extend over the corresponding edge of the sense layer 18. The distances 0x and 0y are determined by the respective distance the sense layer 18 is from the first and second conductors (14, 16) in a 2-axis direction which is a direction into FIGS. 3–5, and is further shown in FIG. 2.

Figure 6:
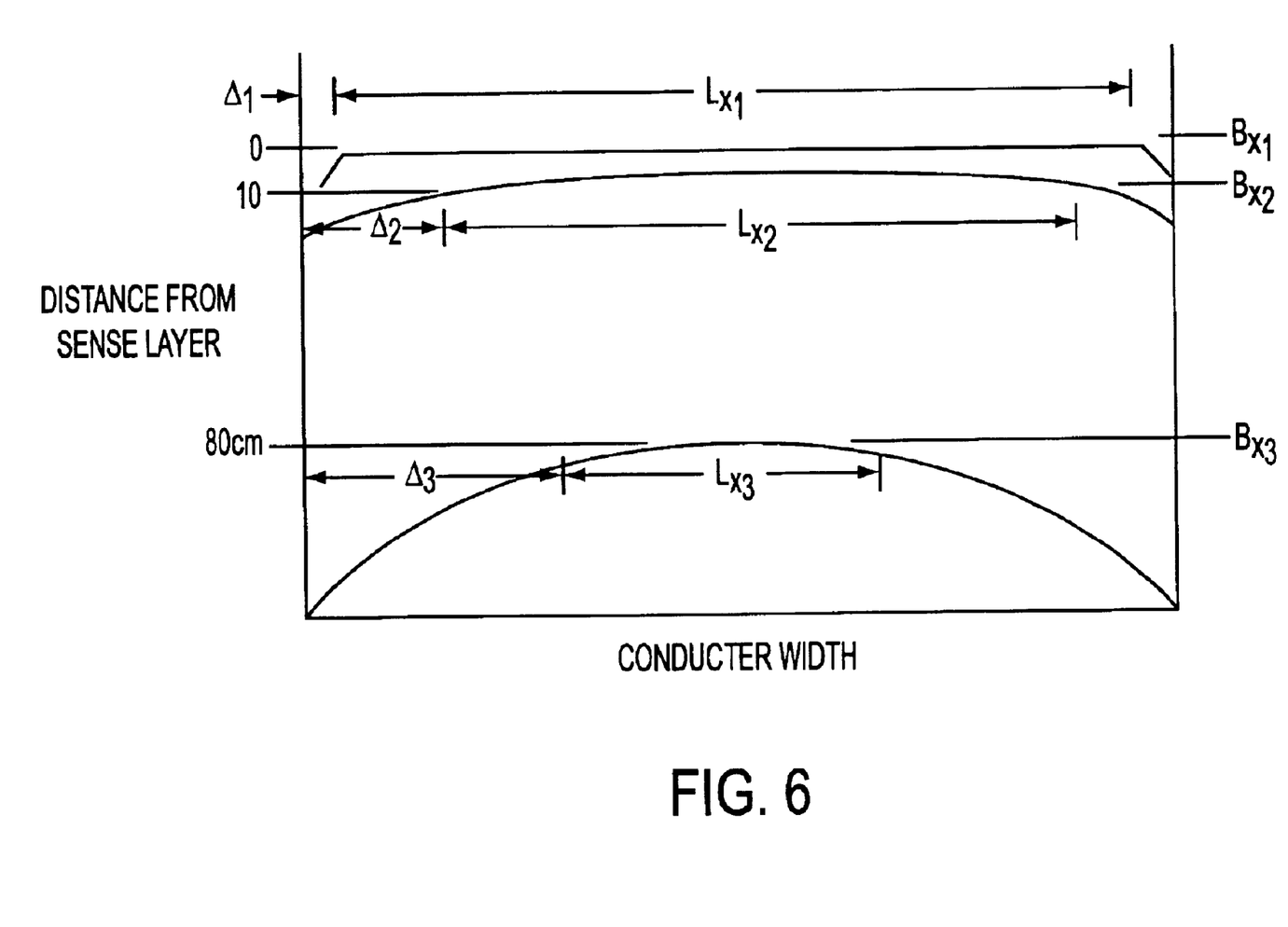
FIG. 6 is a graph of the magnetic flux concentration of a write line relative to its distance from the surface of a memory cell.

FIG. 6 generally illustrates the flux density Bx of a magnetic field relative to the distance between a surface of a conductor and the sense layer 18 in the 2-axis direction. As the distance of the conductor from the sense layer 18 becomes greater, the range of maximum magnetic flux density, Bx, seen by the sense layer 18 becomes narrower. Thus, at a distance of 0 nanometers between the sense layer 18 and a conductor, the magnetic flux density Bx is at its maximum magnitude (shown as $Bx_1$) and is uniform over a very wide band Lx (shown as $Lx_1$). Only at the edges of the conductor does the magnetic flux density Bx begin to fall off. The distance, Ox or Oy, is selected such that the maximum magnetic field generated by the associated conductor occurs substantially at the edge (17 or 19) of the sense layer 18. Accordingly, for a conductor which is relatively close to the sense layer 18, the distance, Ox or Oy, can be within a relatively wide range of values, as long as the edges of the conductor, where the maximum flux concentration falls off, are not positioned substantially at the edge of the sense layer 18. The area where the flux concentration falls off for a conductor to sense layer 18 spacing of 0 nanometers is shown in FIG. 6 by $\Delta_1$. Thus, a conductor edge must be spaced from a sense layer edge (17 or 19) by at least the value $\Delta_1$. That is, Ox or Oy equals $\Delta_1$ FIG. 6 also illustrates the non-uniformity of the maximum magnetic flux density, Bx, of the conductor as the distance z from the sense layer 18 increases. As shown, the maximum magnetic flux density, Bx, seen by the sense layer 18 is lowered (shown as $Bx_2$, $Bx_3$) and begins to exhibit an increasingly narrower range of peak flux density $Lx_2$, $Lx_3$. This is shown in FIG. 6 for z=10 nanometers and z=80 nanometers in which the areas of lower flux concentration $\Delta_2$ and $\Delta_3$ increase respectively. Therefore, as the distance between the conductor and sense layer 18 increases, the amount of distance, Ox and Oy, likewise increases. For the distances of z which are greater than or equal to 80 nanometers, the best distance Ox, Oy is where the conductor longitudinal center line is positioned substantially over the edge (17, 19) of the sense layer 18.

Although the sense layer 18 is illustrated herein as having an oval shape, the sense layer 18 can have numerous shapes that include but are not limited to rectangular, circular or polygonal.

The invention provides an arrangement for a magnetic cell and associated write conductors which can produce magnetization fields sufficient to switch the programming of the sense layer 18 with less current and narrower write conductors.

Figure 7:
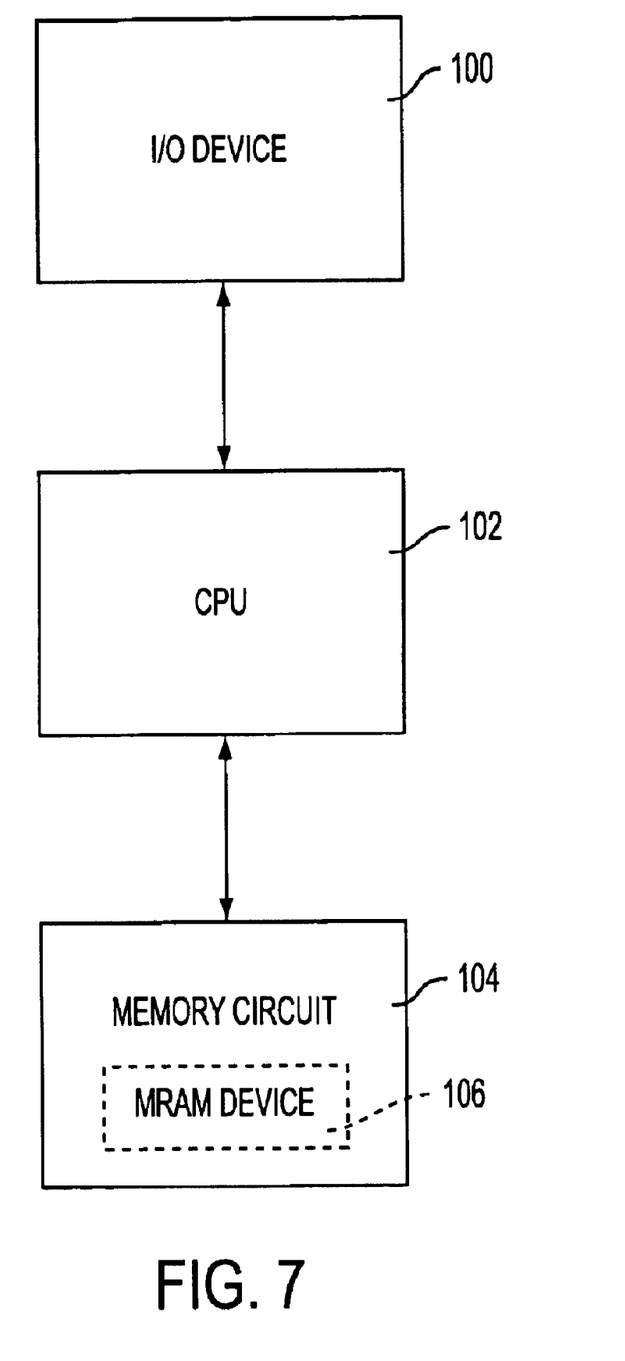
FIG. 7 is a processor system which utilizes an MRAM memory device constructed in accordance with the invention.

FIG. 7 illustrates a processor system (e.g., a computer system), having a memory circuit 104 which includes one or more MRAM memory devices 106. The memory devices 106 have memory cells constructed as described above with reference to FIGS. 3–6. The processor system comprises a central processing unit (CPU) 102, one or more input/output devices (I/O) 100 and the memory devices 106 which exchange data with the CPU 102, typically through a memory controller which is part of memory circuit 104.

Also, the CPU 102 may itself be an integrated processor, in which both the CPU 102 and as one or more memory devices 106 may be integrated on a single chip, the processing system architecture of FIG. 7 is merely exemplary of many different processor system architectures with which the memory device 106 employing the invention can be used.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. Accordingly, the invention is only limited by the scope of the following claims.

What is claimed as new and desired to be protected by Letters Patent of the United States is:

1. A magnetic memory device, comprising:
   a first conductor;
   a second conductor;
   a magnetoresistive memory cell between said first conductor and second conductor, said memory cell having a sense layer; and
   at least one of said first conductor and second conductors having a width narrower than a corresponding sense layer width and extending over an edge of said sense layer in a direction substantially orthogonal to an extending direction of said at least one of said first and second conductors.

2. The memory device of claim 1, where the first conductor and second conductor are substantially orthogonal to each other.

3. The memory device of claim 1, wherein the width of said at least one of said first and second conductors is one-half to two-thirds the width of the corresponding width of said sense layer.

4. The memory device of claim 3, wherein the position of said at least one of said first and second conductors relative to the edge of the sense layer is such that a longitudinal center line of said at least one conductor overlaps the edge of the sense layer.

5. The memory device of claim 3, wherein both of said conductors are narrower in width than a corresponding width of said sense layer.

6. The memory device of claim 5, wherein the width in both of said conductors are one-half to two-thirds the width of the corresponding width of said sense layer.

7. The memory device of claim 5, wherein both said conductors extend over a respective edge of said sense layer in a direction orthogonal to an extending direction of an associated conductor.

8. The memory device of claim 5, wherein at least one of said first and second conductors is positioned such that a longitudinal center line thereof overlaps a corresponding edge of the sense layer.

9. The memory device of claim 5, wherein each of the conductors are positioned such that a longitudinal center line thereof overlaps a corresponding edge of the sense layer.

10. The memory device of claim 1, wherein said first write conductor overlaps only one of a first and second opposing side portions of said sense layer.

11. The memory device of claim 10, wherein said second write conductor overlaps only one of a third and fourth opposing side portions of said sense layer.

12. The memory device of claim 11, wherein said first and second opposing sides have a first axis and said third and fourth opposing sides have a second axis, said first axis and said second axis are substantially orthogonal to each other.

13. The memory device of claim 1, wherein said sense layer has a first and second opposing end portion, an upper portion and a first and second opposing side portions, said first write conductor overlapping only one of said first and second opposing end portions of said sense layer.

14. The memory device of claim 13, wherein said second write conductor overlaps only one of said first and second opposing side portions of said sense layer.

15. A magnetic memory device, comprising:
   a first conductor;
   a second conductor;
   a magnetoresistive memory cell between said first conductor and second conductor, said memory cell having a sense layer; and
   at least one of said first conductor and second conductor having a width narrower than a corresponding sense layer width and extending over an edge of said sense layer, wherein the position of said at least one conductor relative to the edge of the sense layer is such that a peak magnetic flux produced by said at least one conductor is received substantially at said edge of the sense layer.

16. A magnetic memory device, comprising:
   a first conductor;
   a second conductor;
   a magnetoresistive memory cell between said first conductor and second conductor, said memory cell having sense layer; and
   at least one of said first and second conductors being positioned such that a maximum magnetic field generated by said at least one conductor is located substantially at an edge of the sense layer.

17. The memory device of claim 16, where the first conductor and second conductor are substantially orthogonal to each other.

18. The memory device of claim 16, wherein the position of said at least one of said first and second conductors relative to the edge of the sense layer is such that a longitudinal center line of said at least one of said first and second conductors overlaps the edge of the sense layer.

19. The memory device of claim 16, wherein the width of said at least one first and second conductors is one-half to two-thirds the width of the corresponding width of said sense layer.

20. The memory device of claim 16, wherein both of said conductors are narrower in width than a corresponding width of said sense layer.

21. The memory device of claim 20, wherein the width in both of said conductors are one-half to two-thirds the width of the corresponding width of said sense layer.

22. The memory device of claim 20, wherein both said conductors extend over a respective edge of said sense layer.

23. The memory device of claim 20, wherein at least one of said first and second conductors are positioned such that a longitudinal center line thereof overlaps only one of a first and second opposing edge of the sense layer.

24. The memory device of claim 20, wherein each of the conductors is positioned such that a longitudinal center line thereof overlaps a corresponding edge of the sense layer.

25. A magnetic memory device of claim 16, wherein said first write conductor overlaps only one of a first and second opposing side portions of said sense layer.

26. The memory device of claim 25, wherein said second write conductor overlaps only one of a third and fourth opposing side portions of said sense layer.

27. A magnetic memory device having a plurality of memory cell structures, each cell structure comprising:
   a memory cell positioned between a first write conductor and a second write conductor, said memory cell having sense layer which is magnetically affected by currents in said first and second write conductor; and
   at least one of said write conductors having a width narrower than a corresponding width of said sense layer and extending over an edge of said sense layer, wherein said first write conductor overlaps only one of a first and second opposing side portions of said sense layer.

28. The memory device of claim 27, where the first conductor and second conductor are substantially orthogonal to each other.

29. The memory device of claim 27, wherein the position of said at least one conductor relative to the edge of the sense layer is such that a peak magnetic flux produced by said at least one of said first and second conductors is received substantially at said edge of the sense layer.

30. The memory device of claim 27, wherein the position of said at least one of said first and second conductors relative to the edge of the sense layer is such that a longitudinal center line of said at least one of said first and second conductors overlaps the edge of the sense layer.

31. The memory device of claim 27, wherein the width of said at least one of said first and second write conductors is one-half to two-thirds the width of the corresponding width of said sense layer.

32. The memory device of claim 27, wherein both of said conductors are narrower in width than a corresponding width of said sense layer.

33. The memory device of claim 32, wherein the width in both of said conductors are one-half to two-thirds the width of the corresponding width of said sense layer.

34. The memory device of claim 32, wherein both said conductors extend over a respective edge of said sense layer.

35. The memory device of claim 32, wherein at least one of said first and second write conductors are positioned such that a longitudinal center line thereof overlaps an edge of the sense layer.

36. The memory device of claim 32, wherein each of the conductors is positioned such that a longitudinal center line thereof overlaps a corresponding edge of the sense layer.

37. The memory device of claim 27, wherein said second write conductor overlaps only one of a third and fourth opposing side portions of said sense layer.

38. A magnetic memory device having a plurality of cell structures, each cell structure comprising:
   a magnetoresistive memory cell positioned between a first write conductor and a second write conductor, said memory cell having sense layer which is magnetically affected by currents in said first and second write conductors; and
   at least one of said first and second write conductors being positioned so that a maximum magnetic field generated by said at least one of said first and second write conductors is located substantially at an edge of said sense layer.

39. The memory device of claim 38, where the first conductor and second conductor are substantially orthogonal to each other.

40. The memory device of claim 38, wherein the position of said at least one of said first and second conductors relative to the edge of the sense layer is such that the center of said at least one of said first and second conductors overlaps the edge of the sense layer.

41. The memory device of claim 38, wherein the width of said at least one of said first and second conductors is one-half to two-thirds the width of the corresponding width of said sense layer.

42. The memory device of claim 38, wherein both of said conductors are narrower in width than a corresponding width of said sense layer.

43. The memory device of claim 42, wherein the width in both of said conductors are one-half to two-thirds the width of the corresponding width of said sense layer.

44. The memory device of claim 42, wherein both said conductors extend over a respective edge of said sense layer.

45. The memory device of claim 42, wherein at least one of said first and second conductors are positioned such that a longitudinal center line thereof overlaps an edge of the sense layer.

46. The memory device of claim 42, wherein each of the conductors is positioned such that a longitudinal center line thereof overlaps a corresponding edge of the sense layer.

47. A method of fabricating a memory device, comprising:
   forming a memory cell having a sense layer between a first and a second conductor; and
   forming at least one of said first and second conductors to have a width narrower than a corresponding width of the sense layer and to extend over an edge of the sense layer in a direction substantially orthogonal to an extending direction of said at least one of said first and second conductors.

48. The method claim of 47, wherein said at least one conductor is formed such that the position of said at least one conductor relative to the edge of the sense layer can produce a peak magnetic flux substantially at said edge of the sense layer.

49. The method claim of 47, wherein said at least one conductor is formed such that the position of said at least one conductor relative to the edge of the sense layer is such that a longitudinal center line of said at least one conductor overlaps the edge of the sense layer.

50. The method of claim 47, wherein the width of said at least one conductor is one-half to two-thirds the width of the corresponding width of said sense layer.

51. The method of claim 47, where in both of said conductors are fabricated to be narrower in width than a corresponding width of said sense layer.

52. The method of claim 51, where the width in both of said conductors is one-half to two-thirds the width of the corresponding width of said sense layer.

53. The method claim of 51, wherein both said conductors are fabricated to extend over a respective edge of said sense layer.

54. The method claim of 51, wherein at least one of said conductors is formed such that a longitudinal center line thereof overlaps an edge of the sense layer.

55. A method of fabricating a memory device, comprising:
   forming a magnetoresistive memory cell having a sense layer between a first and a second conductor; and
   forming at least one of said conductors being positioned such that a maximum magnetic field generated by said at least one conductor being located substantially at an edge of the sense layer.

56. The method claim of 55, wherein said at least one conductor is formed such that the position of said at least one conductor relative to the edge of the sense layer can produce a peak magnetic flux substantially at said edge of the sense layer.

57. The method claim of 55, wherein said at least one conductor is formed such that the position of said at least one conductor relative to the edge of the sense layer is such that a longitudinal center line of said at least one conductor overlaps the edge of the sense layer.

58. The method of claim 55, wherein the width of said at least one conductor is fabricated to be one-half to two-thirds the width of the corresponding width of said sense layer.

59. The method of claim 55, wherein both of said conductors are fabricated to be narrower in width than a corresponding width of said sense layer.

60. The method of claim 59, wherein the width in both of said conductors are fabricated to be one-half to two-thirds the width of the corresponding width of said sense layer.

61. The method claim of 59, wherein both said conductors are fabricated to extend over a respective edge of said sense layer.

62. The method claim of 59, wherein at least one of said conductors is formed such that a longitudinal center line thereof overlaps an edge of the sense layer.

63. The memory device of claim 55, wherein said first write conductor overlaps only one of a first and second opposing side portions of said sense layer.

64. A method of writing a magnetic memory cell, said method comprising:
passing a write current through a first conductor, a width of which at least partially overlaps an edge of a sense layer of said magnetic memory cell and extends over an edge of said memory cell; and
passing a write current through a second conductor which at least partially overlaps said sense layer of said magnetic memory cell in a direction substantially orthogonal to an extending direction of said at least one of said first and second conductors.

65. The method claim of 64, wherein said at least one conductor is formed such that the position of said at least one conductor relative to the edge of the sense layer can produce a peak magnetic flux substantially at said edge of the sense layer.

66. The method claim of 64, wherein said at least one conductor is formed such that the position of said at least one conductor relative to the edge of the sense layer is such that a longitudinal center line of said at least one conductor overlaps the edge of the sense layer.

67. The method of claim 64, wherein the width of said at least one conductor is fabricated to be one-half to two-thirds the width of the corresponding width of said sense layer.

68. The method of claim 64, wherein both of said conductors are fabricated to be narrower in width than a corresponding width of said sense layer.

69. The method of claim 68, wherein the width in both of said conductors are fabricated to be one-half to two-thirds the width of the corresponding width of said sense layer.

70. The method claim of 68, wherein both said conductors are fabricated to extend over a respective edge of said sense layer.

71. The method claim of 68, wherein at least one of said conductors is formed such that a longitudinal center line thereof overlaps an edge of the sense layer.

72. A method of claim 64, wherein said sense layer has first and second opposing side portions, said first write conductor overlapping only one of said first and second opposing side portions of said sense layer.

73. A method of claim 72, wherein said second write conductor overlaps only one of a third and fourth opposing side portions of said sense layer.

74. A method of operating a magnetic memory cell structure, said memory cell structure comprising a first conductor, a second conductor, a magnetic memory cell between said first and second conductor said having sense layer, where the maximum magnetic field generated by at least one of said first and second conductors is located substantially at an edge of sense layer; said method comprising:
passing a write current through said first conductor; and
passing a write current through said second conductor.

75. A processor system comprising:
a processor; and,
a memory device for exchanging data with said processor, said memory device having a magnetic memory cell structure comprising:
a first conductor;
a second conductor;
a magnetoresistive memory cell between said first conductor and second conductor, said memory cell having a sense layer; and
at least one of said first conductor and second conductor having a width narrower than a corresponding sense layer width and extending over an edge of said sense layer, said first write conductor overlapping only one of a first and second opposing side portions of said sense layer.

76. A processor system of claim 75, wherein said at least one conductor is formed such that the position of said at least one conductor relative to the edge of the sense layer can produce a peak magnetic flux substantially at said edge of the sense layer.

77. The processor system of claim 75, wherein the width of said at least one conductor is fabricated to be one-half to two-thirds the width of the corresponding width of said sense layer.

78. A processor system of claim 75, wherein said at least one conductor is formed such that the position of said at least one conductor relative to the edge of the sense layer is such that a longitudinal center line of said at least one conductor overlaps the edge of the sense layer.

79. A processor system of claim 75, wherein both of said conductors are fabricated to be narrower in width than a corresponding width of said sense layer.

80. A processor system of claim 79, wherein the width in both of said conductors are fabricated to be one-half to two-thirds the width of the corresponding width of said sense layer.

81. A processor system of claim 79, wherein both said conductors are fabricated to extend over a respective edge of said sense layer.

82. A processor system of claim 75, wherein at least one of said conductors is positioned such that a longitudinal center line thereof overlaps an edge of the sense layer.

83. A processor system of claim 75, wherein each of the conductors is formed such that a longitudinal center line thereof overlaps a corresponding edge of the sense layer.

84. A system of claim 75, wherein said second write conductor overlaps only one of a third and fourth opposing side portions of said sense layer.

85. A processor system comprising:
a processor; and,
a memory device for exchanging data with said processor, said memory device having a magnetic memory cell structure comprising:
a first conductor;
a second conductor;
a magnetoresistive memory cell between said first conductor and second conductor, said memory cell having sense layer; and at least one of said conductors being positioned such that a maximum magnetic field generated by said at least one conductor is located substantially at an edge of the sense layer in a direction substantially orthogonal to an extending direction of said at least one of said first and second conductors.

86. The processor system of claim 85, wherein said at least one conductor is formed such that the position of said at least one conductor relative to the edge of the sense layer can produce a peak magnetic flux substantially at said edge of the sense layer.

87. The processor system of claim 85, wherein said at least one conductor is formed such that the position of said at least one conductor relative to the edge of the sense layer is such that a longitudinal center line of said at least one conductor overlaps the edge of the sense layer.

88. The processor system of claim 85, wherein the width of said at least one conductor is fabricated to be one-half to two-thirds the width of the corresponding width of said sense layer.

89. The processor system of claim 85, wherein both of said conductors are fabricated to be narrower in width than a corresponding width of said sense layer.

90. The processor system of claim 89, wherein the width in both of said conductors are fabricated to be one-half to two-thirds the width of the corresponding width of said sense layer.

91. The processor system of claim 89, wherein both said conductors are fabricated to extend over a respective edge of said sense layer.

92. The processor system of claim 85, wherein at least one of said conductors is formed such that a longitudinal center line thereof overlaps an edge of the sense layer.

93. The processor system of claim 85, wherein each of the conductors is positioned such that a longitudinal center line thereof overlaps a corresponding edge of the sense layer.

* * * * *